US006441538B1

(12) United States Patent
Spigelmyer

(10) Patent No.: US 6,441,538 B1
(45) Date of Patent: Aug. 27, 2002

(54) ULTRASOUND STACKED TRANSDUCER AND METHOD FOR STACKING

(75) Inventor: Matthew Spigelmyer, Penna. Furnace, PA (US)

(73) Assignee: Acuson Corporation, Mountain View, CA (US)

( * ) Notice: Subject to any disclaimer, the term of this patent is extended or adjusted under 35 U.S.C. 154(b) by 0 days.

(21) Appl. No.: 09/574,901

(22) Filed: May 19, 2000

(51) Int. Cl.$^7$ ............................................... H01L 41/04
(52) U.S. Cl. .................... 310/334; 310/358; 310/328
(58) Field of Search ..................... 310/328, 330–332, 310/357, 358

(56) References Cited

U.S. PATENT DOCUMENTS

| | | | | |
|---|---|---|---|---|
| 2,841,722 A | * | 7/1958 | Gravley .................. 310/358 X |
| 4,876,776 A | * | 10/1989 | Whatmore et al. ..... 310/357 X |
| 5,142,187 A | * | 8/1992 | Sato et al. ................... 310/358 |
| 5,196,757 A | * | 3/1993 | Omatsu ...................... 310/358 |
| 5,245,734 A | * | 9/1993 | Issartel .................... 310/328 X |
| 5,334,903 A | * | 8/1994 | Smith .......................... 310/358 |
| 5,410,210 A | * | 4/1995 | Sato et al. ................... 310/363 |
| 5,844,349 A | | 12/1998 | Oakley et al. |
| 5,957,851 A | | 9/1999 | Hossack |

* cited by examiner

Primary Examiner—Mark O. Budd

(57) ABSTRACT

A transducer with and method for layering composite materials are provided. A plurality of indentations are provided on one layer, such as associated with etching away ceramic posts relative to a polymer in a composite material. A respective plurality of protrusions is provided on a second layer, such as by etching away a polymer relative to ceramic posts in a composite material. The protrusions insert into the indentations, aligning the two layers.

13 Claims, 4 Drawing Sheets

ULTRASOUND STACKED TRANSDUCER AND METHOD FOR STACKING

BACKGROUND

This invention relates to an ultrasound transducer using stacked piezoelectric composites and method for stacking the transducer. In particular, a method for aligning layers of piezoelectric composite material is provided.

Stacked piezoelectric composite transducers provide improved electrical matching. Broader bandwidth and increased sensitivity may also be provided. Examples of stacked transducers are disclosed in U.S. Pat. No. 6,121,718 (Ser. No. 09/052,776, filed Mar. 31, 1998) and U.S. Pat. No. 5,957,851, the disclosures of which are incorporated herein by reference. Stacked transducers have also been used in commercial embodiments, such as the Acuson S2 transducer.

Medical ultrasound imaging transducers use piezoelectric materials to convert between acoustic and electrical energies. Some piezoelectric materials provide for increased bandwidth and sensitivity as compared to other materials. For example, a 1-3 composite of piezoelectric material extending in one dimension and a bonding polymer extending along three dimensions is commonly used. Such composites have a higher Kt than many other piezoelectric materials or composites. The composites may also be formed into various shapes, increasing the options for window materials and versatility of transducer design.

Using composite materials for stacked transducers requires alignment between the ceramic phase of each layer. An accuracy in the order of ±0.0002 inches is desired. Misalignment results in decreased function of the transducer. If a monolithic stacked ceramic is diced in the elevational dimension to form the composite, the electrical connections are difficult to manage. For practical implementation, the composite microstructure of piezoelectric material within a polymer is generated before the layers are glued together, requiring the precise alignment discussed above.

One method developed for aligning stacked layers of composite materials uses fiduciaries. Fiduciaries or reference holes are placed in the ends of the individual layers. The fiduciaries are aligned while the layers are stacked. However, the desired accuracy is often not consistently provided.

Using a composite layer coupled to a monolithic layer avoids alignment problems. In particular, a 1-3 composite is stacked on a layer of non-composite piezoelectric material. The electrical contacts are manageable where dicing is performed after the plates are glued together. However, this method does not allow forming the transducer into non-planar shapes. Furthermore, the performance advantages of 1-3 composites are limited by this method of alignment.

BRIEF SUMMARY

The present invention is defined by the following claims, and nothing in this section should be taken as a limitation on those claims. By way of introduction, the preferred embodiment described below includes a transducer and using stacked composites and a method for making the transducer. A plurality of indentations are provided on a first layer of composite material, such as associated with etching away piezoelectric material posts (i.e. ceramic phase) relative to a polymer (i.e. epoxy phase). A respective plurality of protrusions are provided on a second layer of composite material, such as associated with etching away the epoxy phase relative to the ceramic phase. The protrusions insert into the indentations, aligning the two layers.

In a first aspect, an ultrasound transducer for converting between electrical and acoustic signals is provided. The transducer comprises a first layer of piezoelectric material. The first layer comprises at least one indentation. A second layer of piezoelectric material is provided. The second layer includes at least one protrusion. The protrusion is adapted for insertion into the indentation.

In a second aspect, a method of manufacturing an ultrasound transducer is provided. At least one indentation is created on a first layer of piezoelectric material. At least one protrusion is created on a second layer of piezoelectric material. The protrusion is inserted into the indentation.

In a third aspect, an ultrasound transducer for converting between electrical and acoustical signals is provided. A first layer comprises a plurality of extensions. A second layer comprises a plurality of receptacles. The receptacles align with the extensions.

Further aspects and advantages of the invention are discussed below in conjunction with the preferred embodiments.

DETAILED DESCRIPTION OF THE PREFERRED EMBODIMENTS

A transducer with accurate alignment of composite layers is provided. A first layer includes one or more indentations. A second layer includes one or more extensions. The extensions are inserted into the indentations to align the two layers. For example, the piezoelectric ceramic phase for two layers of composite material is aligned by using the piezoelectric material for the extensions and indentations. The micro-structure of the composite piezoelectric material aligns the two layers.

Figure 1:
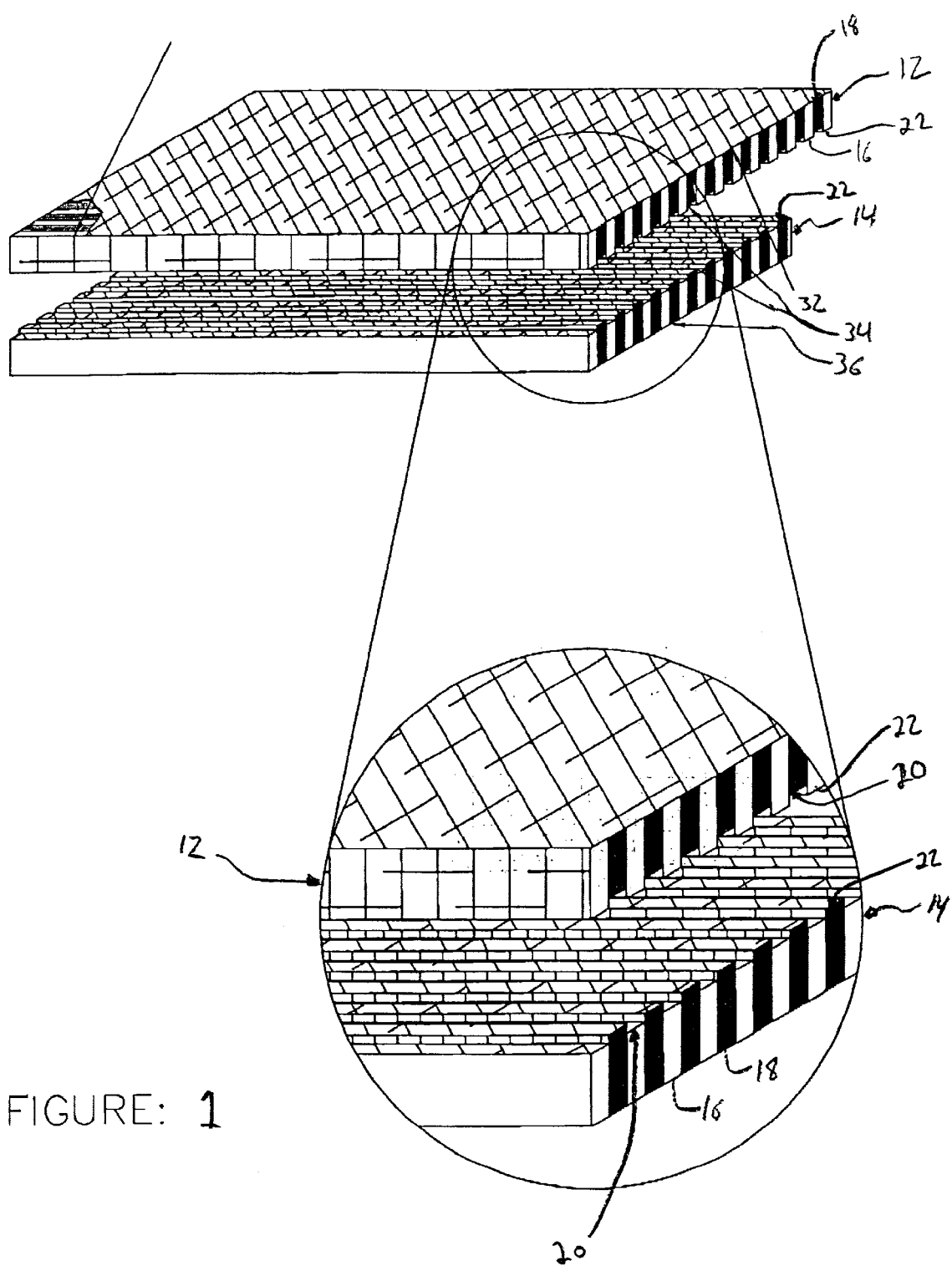
FIG 1 is a graphical representation of two composite layers for a transducer.

FIG. 1 shows top and bottom layers 12 and 14 for a transducer. Two or more layers may be used. The layers 12, 14 comprise piezoelectric material. The piezoelectric material converts acoustic energy to electrical signals and converts electrical signals to acoustic energy. For example, piezoelectric material comprises a piezoelectric ceramic, PZT or SH material. Other types of piezoelectric materials may be used, such as piezostatic materials or materials using micro-machined membranes.

Figure 2:
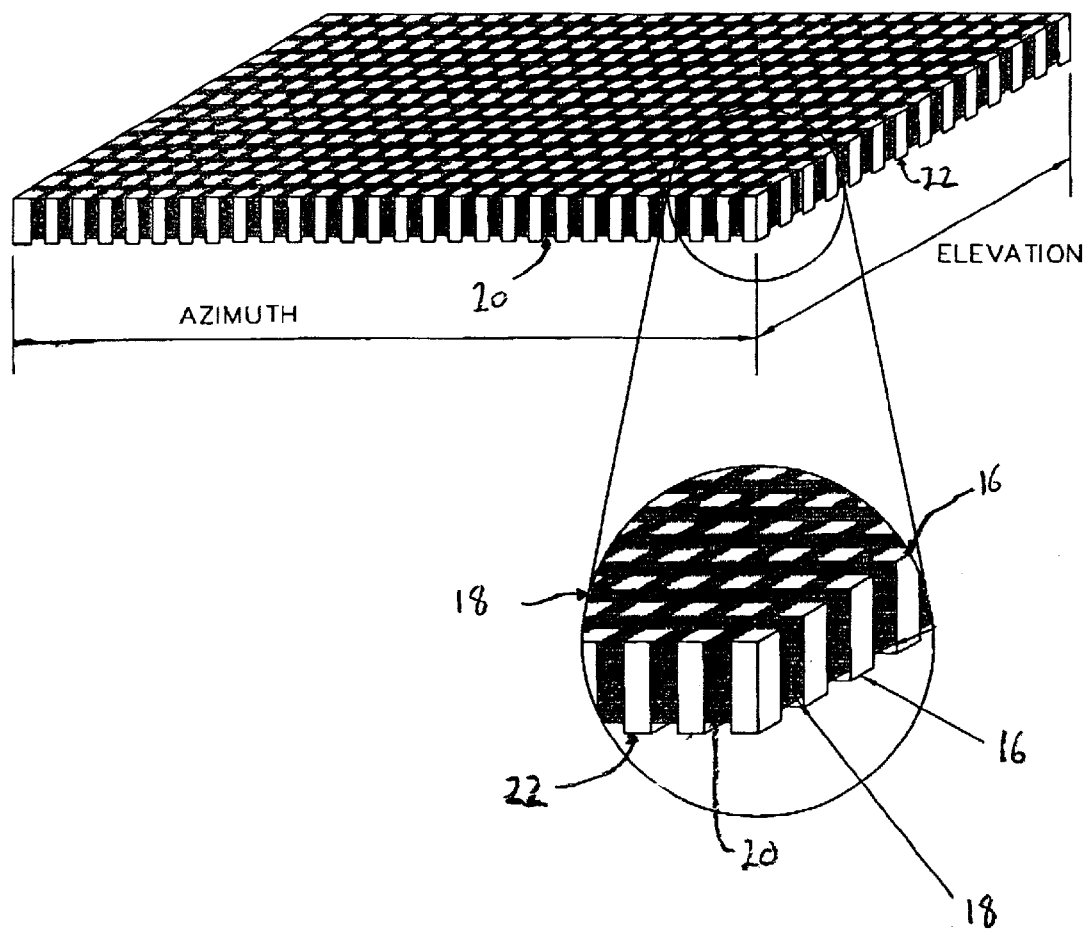
FIG. 2 is a graphical representation of one layer of 1-3 composite material.
Figure 3:
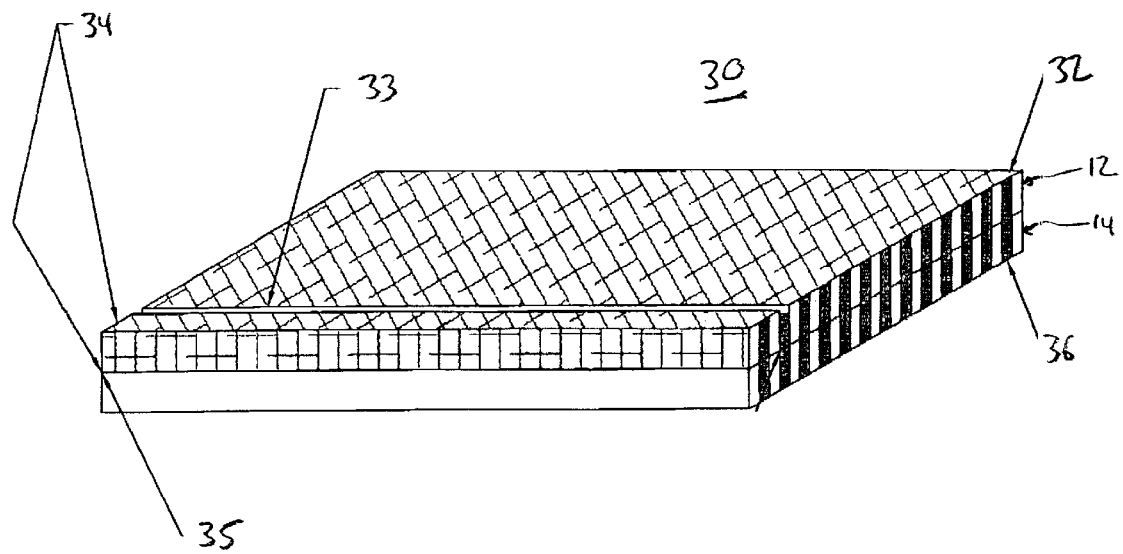
FIG. 3 is a graphical representation of the two composite layers of FIG. 1 as stacked.

In one embodiment, the piezo material of the layers 12, 14 comprise piezo material in a composite. For example, a 2-2 composite (see FIG. 1) or a 1-3 composite (see FIG. 2) is used. As another example, a 1-3 fiber composite is used. Preferably, a 1-3 composite is provided for both layers 12, 14. Referring to FIG. 2, 1-3 composites comprise a plate of polymer 18 (i.e. epoxy phase) with posts 16 of piezoelectric material (i.e. ceramic phase) spaced within the polymer 18. The polymer comprises epoxy, silicon rubber, polyurethane or combinations thereof. The posts 16 comprise any microstructure of piezoelectric material available in composite materials, such as PZT-5H. Referring to FIG. 1, the posts 16 and polymer 18 of a 2-2 composite comprise linearly extending piezoelectric material. Preferably, the composite is formable, such as being bendable to form a non-planar surface when heated.

In one embodiment, the two layers 12, 14 are formed from the same composite material. For example, a slab of composite material at least twice the thickness of an individual layer 12 or 14 is diced in half for form the two layers. By dicing perpendicular to the posts 16 within the composite material, the piezo material of the two layers 12, 14 is positioned within the polymer 18 at a same location for each layer 12, 14.

To align the ceramic phases of the top layer 12 with the bottom layer 14, at least one indentation 20 is provided in either the top layer 12 or the bottom layer 14. The indentations comprise recesses or divots within the layer 12, 14. In alternative embodiments, an aperture or hole through the layer 12 is provided. The cross-section of the indentation 20 is of any shape, such as rectangular, square, circular, oval or another symmetric or non-symmetric shape. Cross-sectional shapes or dimensions that vary as a function of depth for the indentation 20 may be used.

The indentation 20 has a depth within the layer 12 that is 10% of the thickness of the layer 12. Other depths, including lesser or greater depths, may be provided.

In one embodiment, a plurality of indentations 20 is provided. For example, an indentation 20 is provided at the location of each of the posts 16 within the bottom layer 14. In this embodiment, the shape of the indentations 20 corresponds to the shape of the ceramic phase. Indentations 20 that are larger, smaller, shaped differently or positioned in a different location than the posts 16 may be provided. In alternative embodiments, the indentation 20 comprises an indentation into the polymer 18 as shown for the top layer 12.

A protrusion 22 extends from either the top layer 12 or the bottom layer 14. The protrusion 22 comprises an extension from the layer 12, 14. The cross-section of the protrusion comprises one of various shapes, such as circular, oval, square, rectangular, or another symmetric or non-symmetric shape. Cross-sectional shapes or dimensions that vary as a function of height of the protrusion 22 may be used.

The protrusion 22 extends from the layer 14 a distance that is 10% of the thickness of the layer 14. Other heights for the protrusion 22 may be provided, such as greater or lesser heights.

In one embodiment, a plurality of protrusions 22 is provided. For example, a protrusion 22 is provided at the location of each of the posts 16 within the top layer 12. The shape of the protrusions 22 corresponds to the shape of the ceramic phase. In alternative embodiments, the plurality of protrusions 22 is smaller, larger, shaped differently or in a different position than the posts 16. In yet other alternative embodiments, the protrusions 22 are formed from the polymer 18 as shown in the bottom layer 14.

The protrusions 22 and the indentations 20 are adapted to mate. The protrusions 22 and indentations 20 are a same shape. Preferably, the indentations are a substantially same size as the protrusions 22 to provide a snug fit. For example, the indentations 20 and protrusions 22 comprise a same shape as the posts 16. Referring to FIG. 2, the indentations 20 and the protrusions 22 have a same circumference as the posts 16. The depth of the indentations 20 is the same or slightly deeper than the height of the protrusions 22. Alternatively, the height of the protrusions 22 is greater than the depth of the indentations 20. Other characteristics of the protrusions 22 may be different than the indentations 20, such as shape or dimension characteristics.

The protrusions 22 mate with the indentations 20 to align the top layer 12 with the bottom layer 14. The indentations 20 and the protrusions 22 are positioned to align the two layers 12, 14. In particular, the piezoelectric material of the top layer 12 is aligned with the piezoelectric material of the bottom layer 14. For example, the posts 16 of the top layer 12 are aligned with the posts 16 of the bottom layer 14 (i.e. the ceramic phases are aligned). In alternative embodiments, indentations 20 and protrusions 22 are provided on both of the top layer 12 and the bottom layer 14. Different sized, shaped or type of indentations 20 or protrusions 22 may be provided on a same layer 12, 14.

FIG. 3 shows an assembled transducer 30 of stacked composite layers. The transducer 30 includes the top layer 12 and the bottom layer 14. The two layers 12, 14 are aligned by indentations and protrusions. The stacked transducer 30 includes three electrodes, a top electrode 32, a bottom electrode 36, and a middle electrode 34 positioned between the top layer 12 and the bottom layer 14. In alternative embodiments, the middle electrode 34 is not included or comprises two adjacent electrodes. A deactivation cut 33 isolates the middle electrode 34 from the top electrode 32. In one embodiment, both sides of at least one layer 12, 14 are plated or covered with metal electrodes. The electrodes may comprise one piece of material that wraps around the layer 12, 14.

The top layer 12 and the bottom layer 14 are glued or bonded together with an adhesive or epoxy at the joint 35 between the layers 12, 14. The stacked transducer 30 may be kerfed, formed, further bonded or epoxied, and used to manufacture a medical diagnostic ultrasound transducer array, such as a linear, curved linear, sector, Vector®, 1.5 dimensional, or two-dimensional array of multiple transducer elements.

Figure 4:
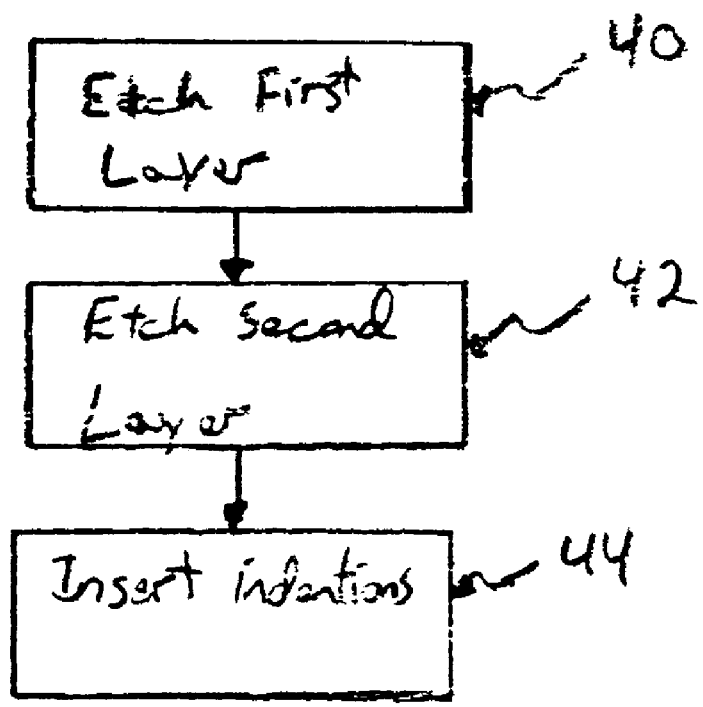
FIG. 4 is a flow chart representing a method of manufacture of a transducer using stacked layers of composite material.

FIG. 4 shows a method for manufacturing the transducer 30. The first layer is etched in act 40. In act 42, the second layer is etched. The resulting protrusions 22 are inserted within the resulting indentations 20 to properly align the two layers 12, 14 in act 44. In one embodiment, the top layer 12 and bottom layer 14 comprise a same composite material, including a same position and structure for the ceramic phase within the epoxy phase.

In act 40, one layer 12, 14 is etched to form the indentations 20. For example, the posts 16 of the top layer 12 are etched. For example, an acid, such as hydrochloric acid, or another chemical or solution that selectively etches one material over another or etches at one location as compared to another location is applied to the layer 12. In one embodiment, a 10% solution of flourboric acid is applied for two minutes. The acid etches the ceramic phase without or with minimal etching of the epoxy phase, forming the indentations 20. In alternative embodiments, the ceramic phase of the bottom layer 14 is etched. In yet other alternative embodiments, the epoxy phase is etched to form the indentations 20.

In act 42, the other layer 12, 14 is etched. In one embodiment, the polymer 18 of the bottom layer 14 is etched to form the protrusions 22. For example, a plasma, such as an oxygen plasma, or other chemical or solution for etching one substance and minimally or not etching another substance or for locationally etching the bottom layer 14 is applied to the bottom layer 14. The plasma removes or dissolves organic or polymer material. In the example of oxygen plasma, the oxygen plasma etches the epoxy phase and does not etch or minimally etches the ceramic phase. In one embodiment, an oxygen plasma is applied for one hour. By removing some of the polymer 18, the protrusions 22 are formed.

In alternative embodiments, other processes other than etching in acid or plasma baths is used. In yet other alternative embodiments, kerfing or dicing processes are used to form the indentations 20 and bonding or other molding processes are used to form the protrusions 22.

In act 44, the indentations 20 are aligned with the protrusions 22. The protrusions 22 are inserted into the indentations 20. The protrusions 22 snugly fit within the indentations 20. Based on the amount of etching provided, the height of the protrusions 22 is similar to the depth of the indentations 20.

Prior to insertion of the protrusions 22 into the indentations 20, the middle electrode 34 is sputtered onto or otherwise applied to one or both of the two layers 12, 14. For example, an electrode is applied to the top of the top layer 12 and wrapped around to the bottom of the top layer 12. Separate electrodes are applied to the top and bottom surfaces of the bottom layer 14. To separate the electrode wrapped around the top layer 12, the electrode is cut or diced. In one embodiment, the electrodes are applied by electroless nickel deposition.

The top layer 12 is glued to the bottom layer 14 using an adhesive, epoxy or other bonding material. The stacked composite materials or electrodes are diced to form the individual array elements. Any resulting kerfs are filled with kerf filler for mechanical strength.

The transducer 30 may be formed. Heat is applied, and the transducer 30 is shaped into a non-planar shape, such as associated with forming a curved linear, sector, or Vector® transducer array. Heat allows the transducer array to more easily bend and form into the non-planar shape. Additional shaping may be used for providing focus, such as for focusing transmissions of acoustic signals in an elevational dimension for scanning an azimuthal by range plane within a patient.

The forming, bonding or gluing of the layers, sputtering of electrodes, kerfing and other manufacturing processes may be performed in any of various orders as known in the art. For example, the layers 12 and 14 are applied onto a backing block or acoustic matching layer and kerfed prior to any bonding or gluing. In one embodiment, the ceramics are bound together, the backing block and matching layers are then glued on to the ceramics, and then the ceramics are diced.

While the invention has been described above by reference to various embodiments, it will be understood that many changes and modifications can be made without departing from the scope of the invention. For example, the protrusions and indentations may be provided in a spatially diverse manner, such as at spaced locations on a layer. by locationally limiting application of the acid or plasma bath or by using other manufacturing techniques.

It is therefore intended that the foregoing detailed description be understood as an illustration of the presently preferred embodiments and not as a definition of the invention. It is only the following claims, including all equivalents that are intended to define the scope of this invention.

What is claimed is:

1. An ultrasound transducer for converting between electrical and acoustic signals, the transducer comprising:
   a first layer of piezoelectric material, the first layer comprising at least one indentation; and
   a second layer of piezoelectric material, the second layer comprising at least one protrusion, the at least one protrusion adapted for insertion and inserted into the at least one indentation;
   wherein the first layer of piezoelectric material comprises composite material having first piezoelectric material and polymer portions and the second layer of piezoelectric material comprises composite material having second piezoelectric material and polymer portions, the at least one indentation comprising an indentation in the first piezoelectric material portion and the at least one protrusion comprising a protrusion in the second polymer portion.

2. The transducer of claim 1 wherein the first layer is glued to the second layer.

3. The transducer of claim 1 wherein the first layer aligns with the second layer where the at least one protrusion is inserted within the at least one indentation.

4. The transducer of claim 3 wherein the at least one protrusion comprises a plurality of protrusions and the at least one indentation comprises a plurality of indentations, ones of the plurality of protrusions adapted for insertion within respective ones of the plurality of indentations.

5. The transducer of claim 1 wherein the first and second layers comprise composite layers of piezoelectric material and polymer material, the at least one protrusion comprises a post of piezoelectric material extending from polymer material and the at least one indentation comprises a post of piezoelectric material recessed relative to polymer material.

6. The transducer of claim 1 further comprising a plurality of electrodes, at least a first one of the plurality of electrodes operatively connected with the first layer and at least a second one of the plurality of electrodes operatively connected with the second layer.

7. The transducer of claim 1 wherein the at least one indentation comprises a recess in a first ceramic relative to a first epoxy and the at least one protrusion comprises an extension in a second ceramic relative to a second epoxy.

8. The transducer of claim 1 wherein the transducer is free of an electrode between the first and second layers.

9. An ultrasound transducer for converting between electrical and acoustic signals, the transducer comprising:
   a first layer of piezoelectric material, the first layer comprising at least one indentation; and
   a second layer of piezoelectric material, the second layer comprising at least one protrusion, the at least one protrusion adapted for insertion and inserted into the at least one indentation;
   wherein the first layer of piezoelectric material comprises composite material having first piezoelectric material and polymer portions and the second layer of piezoelectric material comprises composite material having second piezoelectric material and polymer portions, the at least one indentation comprising an indentation in the first polymer portion and the at least one protrusion comprising a protrusion in the second piezoelectric material portion.

10. An ultrasound transducer for converting between electrical and acoustic signals, the transducer comprising:
    a first layer comprising a plurality of extensions; and
    a second layer comprising a plurality of receptacles;
    wherein the extensions align with the receptacles;
    wherein the first and second layers comprises layers of composite material, and
    wherein piezoelectric material microstructure of the first layer aligns with piezoelectric material microstructure of the second layer as a function alignment of the extensions with the receptacles.

11. The transducer of claim 10 wherein the extensions are inserted into the receptacles.

12. An ultrasound transducer for converting between electrical and acoustic signals, the transducer comprising:
- a first layer of piezoelectric material, the first layer comprising at least one indentation; and
- a second layer of piezoelectric material, the second layer comprising at least one protrusion, the at least one protrusion adapted for insertion into the at least one indentation;

wherein the first and second layers comprise first and second respective pluralities of piezoelectric material portions and polymer portions, the first plurality of piezoelectric material portions extending from the first layer and the second plurality of piezoelectric material portions indented within the second layer.

13. The transducer of claim 12 wherein the transducer is free of an electrode between the first and second layers.

* * * * *